(12) United States Patent
Kim

(10) Patent No.: US 6,650,023 B2
(45) Date of Patent: Nov. 18, 2003

(54) APPARATUS FOR DEPOSITING THIN FILM

(75) Inventor: Chang Nam Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 10/241,663

(22) Filed: Sep. 12, 2002

(65) Prior Publication Data

US 2003/0047817 A1 Mar. 13, 2003

(30) Foreign Application Priority Data

Sep. 13, 2001 (KR) ..................................... P2001-56492

(51) Int. Cl.[7] ............................................. H01L 23/544
(52) U.S. Cl. ..................... 257/797; 118/504; 118/723; 118/300; 438/507; 438/509
(58) Field of Search ........................... 257/797; 118/504, 118/723, 728, 300, 724; 438/507, 509

(56) References Cited

U.S. PATENT DOCUMENTS 6,101,086 A * 8/2000 Kim et al. ................... 361/683
6,346,731 B1 * 2/2002 Nakajima et al. ........... 257/381

* cited by examiner

Primary Examiner—Nathan J. Flynn
Assistant Examiner—Pershelle Greene
(74) Attorney, Agent, or Firm—Fleshner & Kim, LLP

(57) ABSTRACT

Disclosed is a thin film deposition apparatus for depositing a thin film on a display panel including a deposition source having a groove in one surface wherein the groove is filed with a thin film material to be deposited on the panel, a heater applying heat to the deposition source so as to sublimate the thin film material, and a mask loaded on the deposition source so as to cover the groove of the deposition source, the mask having a plurality of holes to adjust a deposition quantity of the thin film material deposited on the panel.

27 Claims, 5 Drawing Sheets

APPARATUS FOR DEPOSITING THIN FILM

This application claims the benefit of the Korean Application No. P2001-56492 filed on Sep. 13, 2001, which is hereby incorporated by reference.

BACKGROUND OF THE INVENTION

1. Field of the Invention

The present invention relates to a thin film deposition apparatus, and more particularly, to an apparatus for depositing a thin film used in fabricating a display panel.

2. Discussion of the Related Art

Generally, a thin film deposition apparatus used for the fabrication of a display panel enables to deposit a demanded material on a panel uniformly. And, there are various types of such apparatuses.

Specifically, in case of an organic EL(electroluminescent) display panel, when an organic layer is deposited on a panel, a thermal sublimation type thin film deposition apparatus is used. In this case, the thin film deposition apparatus is one of crucible, boat, and basket types, etc. Yet, such thin film deposition apparatuses have small capacities so as not to be suitable for the fabrication of large-sized organic EL display panels.

In order to overcome such a problem, a linear type thin film deposition apparatus having the same size of a width of a large-sized display panel has been developed.

The linear type thin film deposition apparatus, as shown in FIG. 1, includes a deposition source 10 having a long body, a groove 11 formed inside the deposition source 10, and a heater(not shown in the drawing) built inside or outside the deposition source 10. Moreover, the groove 11 is filed with a deposition material to be deposited on a panel.

When the above-constituted linear type thin film deposition apparatus is used, as shown in FIG. 2, the deposition source 10 is arranged under a panel 1 so as to leave a predetermined interval from the panel 1 and a current is applied to the heater. The deposition material filing the groove 11 is then sublimated by heat generated from the heater so as to be deposited on a surface of the panel 1. And, the deposition source 10 moves along a scan direction so as to deposit the deposition material on an entire surface of the panel 1.

The thin film deposition apparatus according to the related art has a fast deposition rate and enables to load a large capacity of the deposition material so as to be advantageous for mass production. Yet, the deposition thickness of the thin film deposited on the panel fails to be uniform. For instance, a thickness of a thin film 2 formed in a scan direction of the panel 1, as shown in FIG. 2, is uniform but the other thickness of the thin film 2 formed in a length direction of the panel 1 is not uniform.

The thickness of the thin film deposited on the panel is not limited to the example shown in FIG. 2 but may differ in each position of the panel according to the structure and characteristics of the thin film deposition apparatus.

The irregularity of the thin film deposited by the thin film deposition apparatus according to the related art increases as a size of a panel to be fabricated increases.

SUMMARY OF THE INVENTION

Accordingly, the present invention is directed to an apparatus for depositing a thin film that substantially obviates one or more problems due to limitations and disadvantages of the related art.

An object of the present invention is to provide an apparatus for depositing a thin film enabling to form a large-sized thin film uniformly.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, in a thin film deposition apparatus for depositing a thin film on a display panel, an apparatus for depositing the thin film according to the present invention includes a deposition source having a groove in one surface wherein the groove is filed with a thin film material to be deposited on the panel, a heater applying heat to the deposition source so as to sublimate the thin film material, and a mask loaded on the deposition source so as to cover the groove of the deposition source, the mask having a plurality of holes to adjust a deposition quantity of the thin film material deposited on the panel.

Preferably, the heater is installed inside or outside the deposition source.

Preferably, a shape of the mask is equivalent to that of the groove of the deposition source.

Preferably, each of the holes has a pattern selected from the group consisting of circle, triangle, rectangle, and polygon.

Preferably, a number and a distribution of the holes formed on the mask depend on the sublimated quantity of the thin film material Preferably, the holes of the mask are distributed so as to be concentrated on a central portion of the mask rather than an edge portion of the mask in a gradient manner from the central portion to the edge portion.

Preferably, the holes of the mask are distributed so as to be concentrated on an edge portion of the mask rather than a central portion of the mask in a gradient manner from the edge portion to the central portion.

Preferably, the holes of the mask are distributed so as to be concentrated on one edge portion of the mask rather than the other edge portion of the mask in a gradient manner from one edge portion to the other edge portion.

Preferably, the holes of the mask are arranged regularly.

More preferably, the holes of the mask are equal to each other in size and have different intervals from each other.

More preferably, the holes of the mask are different from each other in size and have different intervals from each other.

Preferably, the mask is heated to a predetermined temperature by the heater or an additional heater.

In another aspect of the present invention, in a thin film deposition apparatus for depositing a thin film on a display panel, an apparatus for depositing the thin film includes a deposition source having a groove in one surface wherein the groove is filed with a thin film material to be deposited on the panel, a first heater applying heat to the deposition source so as to sublimate the thin film material, a mask loaded on the deposition source so as to cover the groove of the deposition source, the mask having a plurality of holes to adjust a deposition quantity of the thin film material deposited on the panel, and a second heater applying heat to the mask so that the sublimated thin film material fails to adhere to the mask.

Preferably, the first heater is installed inside or outside the deposition source and the second heater is installed inside or outside the mask.

Preferably, each of the holes has a pattern selected from the group consisting of circle, triangle, rectangle, and polygon.

Preferably, a number and a distribution of the holes formed on the mask depend on the sublimated quantity of the thin film material.

Preferably, the holes of the mask are arranged regularly.

More preferably, the holes of the mask are equal to each other in size and have different intervals from each other.

More preferably, the holes of the mask are different from each other in size and have different intervals from each other.

In a further aspect of the present invention, in a thin film deposition apparatus for depositing a thin film on a display panel, an apparatus for depositing the thin film includes a deposition source having a groove in one surface wherein the groove is filed with a thin film material to be deposited on the panel, a mask loaded on the deposition source so as to cover the groove of the deposition source, and a mask heater loaded on the deposition source so as to cover the groove of the deposition source, the mask heater having a plurality of holes to adjust a deposition quantity of the thin film material deposited on the panel, the mask heater applying heat to the deposition source so as to sublimate the thin film material.

Preferably, the mask heater is formed Ni or W.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
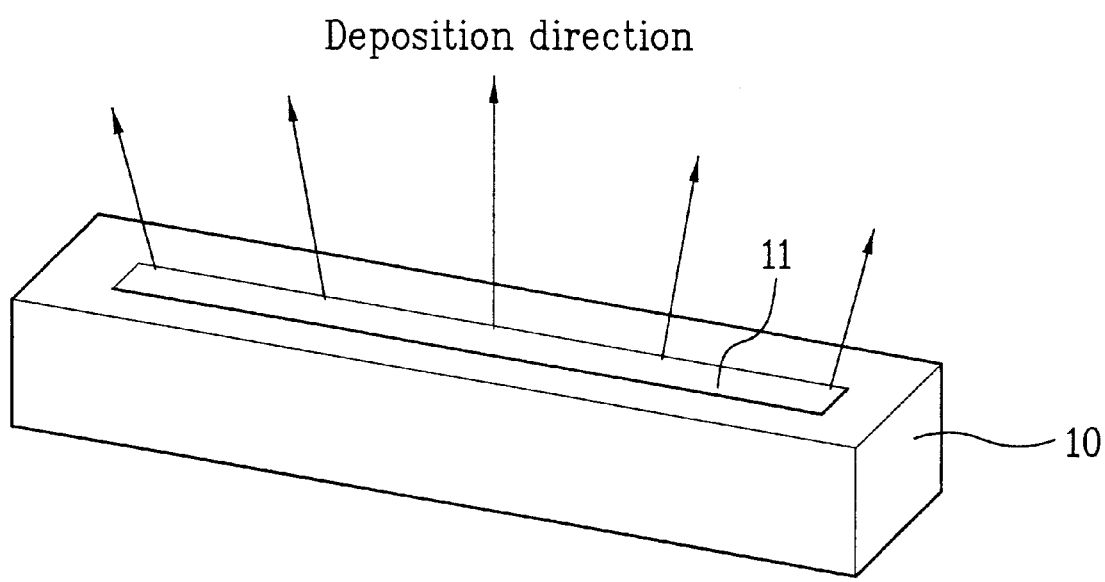
FIG. 1 illustrates a bird's-eye view of a thin film deposition apparatus according to a related art.
Figure 2:
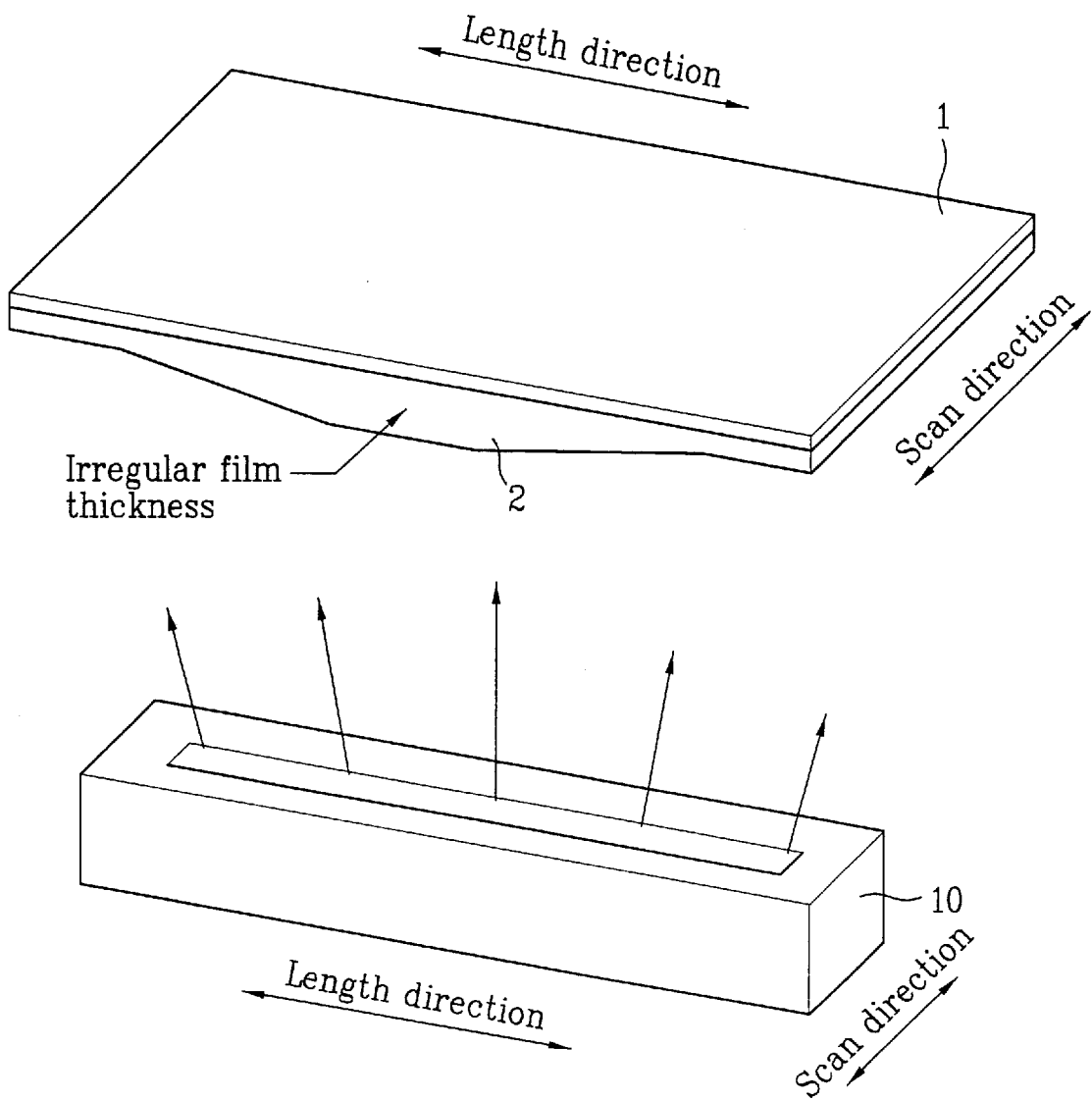
FIG. 2 illustrates a diagram for a thin film deposited irregularly on a display panel using the thin film deposition apparatus in FIG. 1.
Figure 3:
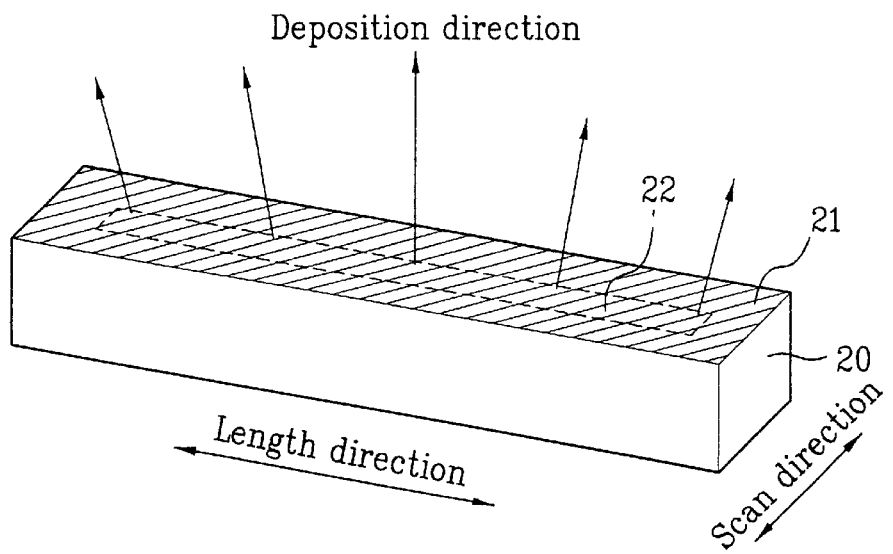
FIG. 3 illustrates a bird's-eye view of a thin film deposition apparatus according to a first embodiment of the present invention.

FIG. 3 illustrates a bird's-eye view of a thin film deposition apparatus according to a first embodiment of the present invention.

Referring to FIG. 3, a first embodiment of the present invention includes a linear type deposition source 20, a heater(not shown in the drawing), and a mask 21 having a plurality of holes.

A groove 22 is formed in an upper surface of the deposition source 20, and filed with a thin film material to be deposited on a display panel. In addition to the linear type in FIG. 3, the deposition source 20 can be prepared with a variety of types according to the fabrication method of the display panel. Besides, the groove 22 can be formed inside a lateral side of the deposition source 20.

Moreover, the heater(not shown in the drawing) is installed inside or outside the deposition source 20. The heater applies heat to the deposition source 20 so as to sublimate the thin film material filling the groove 22 of the deposition source 20.

The mask 21 is installed to cover the groove 22 of the deposition source 20 and has a plurality of holes enabling to adjust amount of the sublimated thin film material. A shape of the mask 21 is arbitrarily fabricated, and is preferably fabricated to have the same shape of the groove 22 of the deposition source 20. The mask 21 is formed about 1~10 m thick, and formed with one of metal, metal alloy, polymer film, inorganic substance, and the like. Specifically, one of Ni, Ni alloy, W is preferred for the mask 21.

The reason why the mask 21 is installed on the groove 22 of the deposition source 20 is that the quantity of the sublimated thin film material differs in each position from the groove 22 of the deposition source 20 owing to the shape of the deposition source 20, the material of the deposition source 20, the species of the thin film material, and the like. Namely, the thin film material filling the deposition source 20 is sublimated differently in accordance with the position of the thin film material, whereby the thickness of the thin film deposited on the display panel is irregular.

Therefore, the present invention prepares the mask so as to cope with the characteristics of the thin film deposition apparatus, and enables to deposit the thin film on the display panel uniformly using the mask.

Figure 4A:
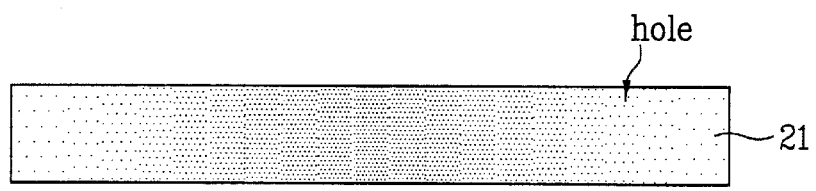
FIGS. 4A to 4C illustrate diagrams of hole distributions of a mask attached to the thin film deposition apparatus in FIG. 3, respectively.
Figure 4B:
Figure 4C:
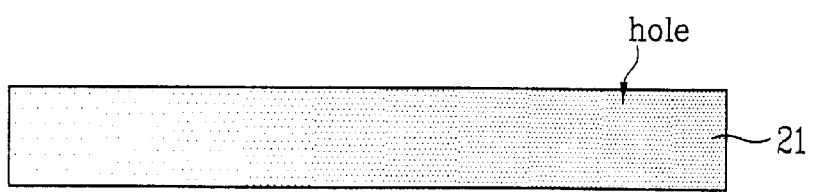

FIGS. 4A to 4C illustrate diagrams of hole distributions of a mask attached to the thin film deposition apparatus in FIG. 3, respectively.

Referring to FIG. 4A, a mask 21 is used when a thin film material is sublimated most actively at each edge portion of a deposition source 20 and most inactively in a central portion of the deposition source 20. Hence, holes of the mask 21 are distributed from a central portion to edge portions in a gradient manner that the holes are more concentrated at the central portion rather than the edge portions. Namely, an opening ratio of each of the edge portions is low, while that of the central portion is high.

Referring to FIG. 4B, a mask 21 is used when a thin film material is sublimated most actively at a central portion of a deposition source 20 and most inactively in each edge portion of the deposition source 20. Hence, holes of the mask 21 are distributed from a central portion to edge portions in a gradient manner that the holes are more concentrated at each of the edge portions rather than the central portion. Namely, an opening ratio of each of the edge portions is high, while that of the central portion is low.

Referring to FIG. 4C, a mask 21 is used when a thin film material is sublimated most actively at one edge portion of a deposition source 20 and most inactively in the other edge portion of the deposition source 20. Hence, holes of the mask 21 are distributed from a central portion to edge portions in a gradient manner that the holes are more concentrated at one edge portion rather than the other edge portion. Namely, an opening ratio of one edge portion is low, while that of the other edge portion is high.

Besides, the mask of the present invention can be modified variously.

Figure 5A:
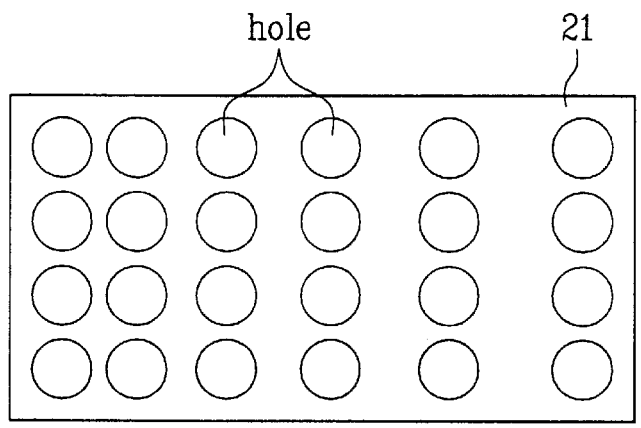
FIGS. 5A to 5C illustrate diagrams of hole shapes and arrangement intervals of a mask attached to the thin film deposition apparatus in FIG. 3, respectively.
Figure 5B:
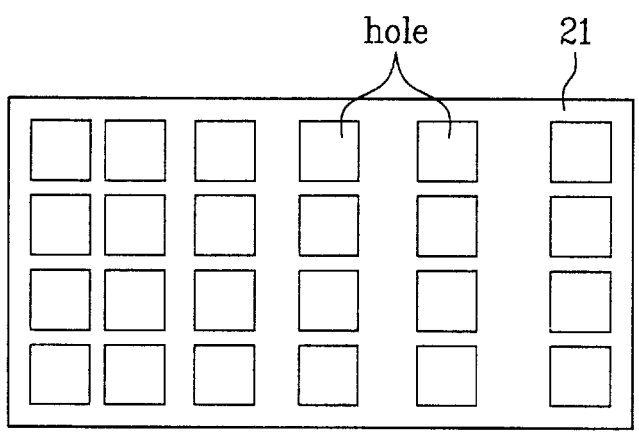
Figure 5C:
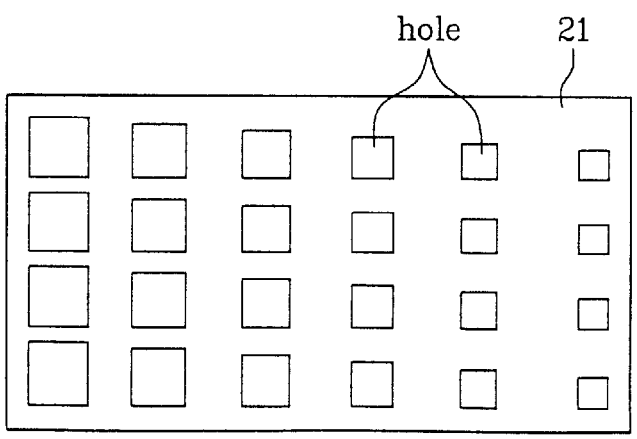

FIGS. 5A to 5C illustrate diagrams of hole shapes and arrangement intervals of a mask attached to the thin film deposition apparatus in FIG. 3, respectively.

Referring to FIGS. 5A to 5C, holes of a mask 21 are arranged regularly. And, the holes of the mask 21 can be formed to have various shapes such as circle, triangle, rectangle, polygon, and the like. Moreover, the number and distribution of the holes formed on the mask 21 depend on a quantity of a sublimated thin film material.

The mask 21 shown in FIG. 5A or FIG. 5B includes the holes having the same size so as to leave different intervals from each other in column. And, another mask 21 shown in FIG. 5C includes the holes having different sizes so as to leave different intervals from each other in column.

Thus, the deposition source having the mask loaded thereon is placed under the panel so as to leave a predetermined interval from the panel. In order to apply heat to the deposition source, a current is applied to a heater installed at the deposition source. The deposition material filing the groove in the deposition source is then sublimated by the heat generated from the heater so as to be deposited on a surface of the panel. And, the deposition source moves along a scan direction so as to deposit the deposition material on an entire surface of the panel.

Occasionally, the thin film material can adhere to the surface of the mask instead of reaching the panel through the holes of the mask. This happens because a surface temperature of the mask is lower than a temperature of the sublimated thin film material. Hence, it is necessary to increase the temperature of the mask by applying heat to the mask so as to be higher than the temperature of the sublimated thin film material.

In order to increase the temperature of the mask, an additional heater is installed for the mask or the heater used for the deposition source can be shared by the mask. When the additional heater is installed for the mask, the heater can be installed inside or outside the mask.

Additionally, in order to simplify the composition of the thin film deposition apparatus, it can be used the mask itself as a heater applying heat to the deposition source. The mask heater is formed metal or metal alloy. Specifically, one of Ni, Ni alloy, W and the like is preferred for the mask heater.

Figure 6:
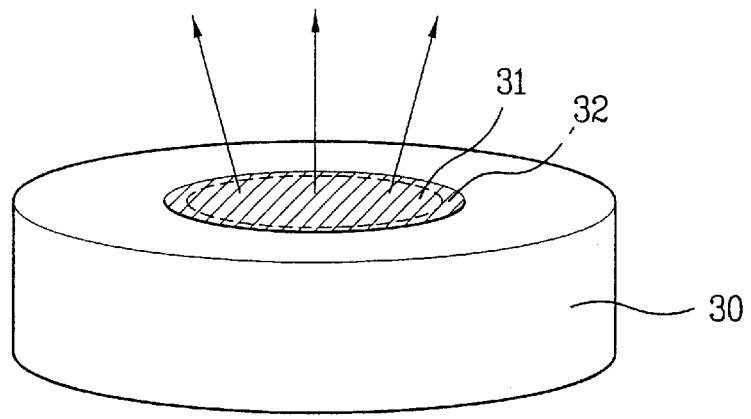
FIG. 6 illustrates a bird's-eye view of a thin film deposition apparatus according to a second embodiment of the present invention.
Figure 7A:
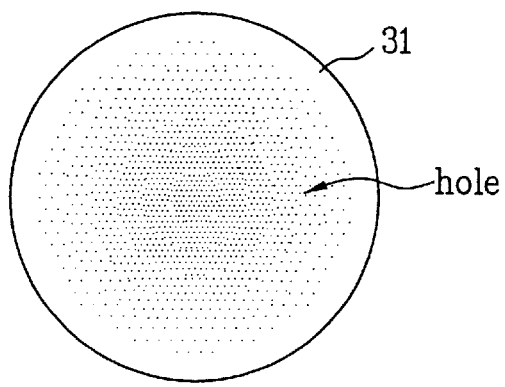
FIG. 7A and FIG. 7B illustrate diagrams of hole distributions of a mask attached to the thin film deposition apparatus in FIG. 6, respectively.
Figure 7B:
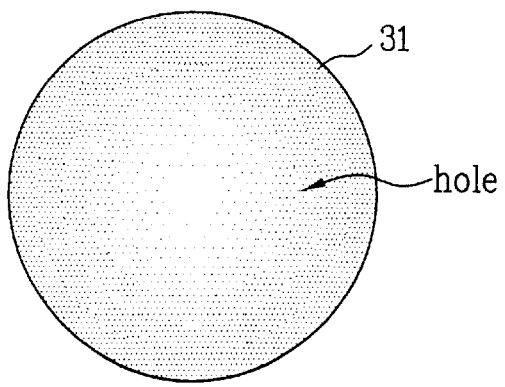

FIG. 6 illustrates a bird's-eye view of a thin film deposition apparatus according to a second embodiment of the present invention, and FIG. 7A and FIG. 7B illustrate diagrams of hole distributions of a mask attached to the thin film deposition apparatus in FIG. 6, respectively.

A second embodiment of the present invention, as shown in FIG. 6, includes a crucible type deposition source 30, a heater(not shown in the drawing), and a mask 31 having a plurality of holes.

A recess 32 is formed in an upper surface of the crucible type deposition source 30, and filed with a thin film material to be deposited on a display panel.

Moreover, the heater(not shown in the drawing) is installed inside or outside the deposition source 30. The heater applies heat to the deposition source 30 so as to sublimate the thin film material filling the recess 32 of the deposition source 30.

The mask 31 is installed to cover the recess 32 of the deposition source 30 and has a plurality of holes enabling to adjust amount of the sublimated thin film material. A shape of the mask 31 can be fabricated arbitrarily, and is preferably fabricated to have the same shape of the recess 32 of the deposition source 30. The mask 31 is formed about 1~10 m thick, and formed with one of metal, metal alloy, polymer film, inorganic substance, and the like. Specifically, one of Ni, Ni alloy, W is preferred for the mask 21.

Referring to FIG. 7A, a mask 21 is used when a thin film material is sublimated most actively at an edge portion of a deposition source 30 and most inactively in a central portion of the deposition source 30. Hence, holes of the mask 31 are distributed from a central portion to edge portions in a gradient manner that the holes are more concentrated at the central portion rather than the edge portion. Namely, an opening ratio of the edge portion of the mask 31 is low, while that of the central portion is high.

Referring to FIG. 7B, a mask 21 is used when a thin film material is sublimated most actively at a central portion of a deposition source 20 and most inactively in an edge portion of the deposition source 30. Hence, holes of the mask 31 are distributed from a central portion to edge portions in a gradient manner that the holes are more concentrated at the edge portion rather than the central portion. Namely, an opening ratio of the edge portion of the mask 31 is high, while that of the central portion is low.

Therefore, the present invention adjusts the sublimated quantity of the thin film material using the mask having the opening ratio suitable for deposition characteristics of the deposition source, thereby enabling to deposit a thin film on a display panel uniformly. Hence, the thin film deposition apparatus according to the present invention enables to deposit the thin film on a large-sized display panel uniformly and quickly, thereby improving a reliance of the fabrication process.

It will be apparent to those skilled in the art than various modifications and variations can be made in the present invention. Thus, it is intended that the present invention covers the modifications and variations of this invention provided they come within the scope of the appended claims and their equivalents.

What is claimed is:

1. In a thin film deposition apparatus for depositing a thin film on a display panel, an apparatus for depositing the thin film, comprising:

a deposition source having a groove in one surface wherein the groove is filed with a thin film material to be deposited on the panel;

a heater applying heat to the deposition source so as to sublimate the thin film material; and a mask loaded on the deposition source so as to cover the groove of the deposition source, the mask having a plurality of holes to adjust a deposition quantity of the thin film material deposited on the panel.

2. The apparatus of claim 1, wherein the heater is installed inside or outside the deposition source.

3. The apparatus of claim 1, wherein a shape of the mask is equivalent to that of the groove of the deposition source.

4. The apparatus of claim 1, wherein each of the holes has a pattern selected from the group consisting of circle, triangle, rectangle, and polygon.

5. The apparatus of claim 1, wherein a number and a distribution of the holes formed on the mask depend on the sublimated quantity of the thin film material.

6. The apparatus of claim 1, wherein the holes of the mask are distributed so as to be concentrated on a central portion of the mask rather than an edge portion of the mask in a gradient manner from the central portion to the edge portion.

7. The apparatus of claim 1, wherein the holes of the mask are distributed so as to be concentrated on an edge portion of the mask rather than a central portion of the mask in a gradient manner from the edge portion to the central portion.

8. The apparatus of claim 1, wherein the holes of the mask are distributed so as to be concentrated on one edge portion of the mask rather than the other edge portion of the mask in a gradient manner from one edge portion to the other edge portion.

9. The apparatus of claim 1, wherein the holes of the mask are arranged regularly.

10. The apparatus of claim 9, wherein the holes of the mask are equal to each other in size and have different intervals from each other.

11. The apparatus of claim 9, wherein the holes of the mask are different from each other in size and have different intervals from each other.

12. The apparatus of claim 1, wherein the mask is heated to a predetermined temperature by the heater or an additional heater.

13. In a thin film deposition apparatus for depositing a thin film on a display panel, an apparatus for depositing the thin film, comprising:

a deposition source having a groove in one surface wherein the groove is filed with a thin film material to be deposited on the panel;

a first heater applying heat to the deposition source so as to sublimate the thin film material;

a mask loaded on the deposition source so as to cover the groove of the deposition source, the mask having a plurality of holes to adjust a deposition quantity of the thin film material deposited on the panel; and a second heater applying heat to the mask so that the sublimated thin film material fails to adhere to the mask.

14. The apparatus of claim 13, wherein the first heater is installed inside or outside the deposition source and the second heater is installed inside or outside the mask.

15. The apparatus of claim 13, wherein each of the holes has a pattern selected from the group consisting of circle, triangle, rectangle, and polygon.

16. The apparatus of claim 13, wherein a number and a distribution of the holes formed on the mask depend on the sublimated quantity of the thin film material.

17. The apparatus of claim 13, wherein the holes of the mask are arranged regularly.

18. The apparatus of claim 17, wherein the holes of the mask are equal to each other in size and have different intervals from each other.

19. The apparatus of claim 17, wherein the holes of the mask are different from each other in size and have different intervals from each other.

20. In a thin film deposition apparatus for depositing a thin film on a display panel, an apparatus for depositing the thin film, comprising:

a deposition source having a groove in one surface wherein the groove is filed with a thin film material to be deposited on the panel; and a mask heater loaded on the deposition source so as to cover the groove of the deposition source, the mask heater having a plurality of holes to adjust a deposition quantity of the thin film material deposited on the panel, the mask heater applying heat to the deposition source so as to sublimate the thin film material.

21. The apparatus of claim 20, wherein the mask heater is formed metal or metal alloy.

22. The apparatus of claim 21, wherein the metal is Ni or W.

23. The apparatus of claim 20, wherein each of the holes has a pattern selected from the group consisting of circle, triangle, rectangle, and polygon.

24. The apparatus of claim 20, wherein a number and a distribution of the holes formed on the mask heater depend on the sublimated quantity of the thin film material.

25. The apparatus of claim 20, wherein the holes of the mask heater are arranged regularly.

26. The apparatus of claim 25, wherein the holes of the mask heater are equal to each other in size and have different intervals from each other.

27. The apparatus of claim 25, wherein the holes of the mask heater are different from each other in size and have different intervals from each other.

* * * * *